(12) United States Patent
Nam et al.

(10) Patent No.: US 8,390,128 B2
(45) Date of Patent: Mar. 5, 2013

(54) SEMICONDUCTOR PACKAGE AND STACK SEMICONDUCTOR PACKAGE HAVING THE SAME

(75) Inventors: Jong Hyun Nam, Gyeonggi-do (KR); Ki Young Kim, Gyeonggi-do (KR); Jin Ho Bae, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 140 days.

(21) Appl. No.: 12/834,115

(22) Filed: Jul. 12, 2010

(65) Prior Publication Data

US 2011/0156269 A1    Jun. 30, 2011

(30) Foreign Application Priority Data

Dec. 31, 2009   (KR) .................. 10-2009-0135202

(51) Int. Cl.
*H01L 23/48* (2006.01)
(52) U.S. Cl. .................................................. 257/774
(58) Field of Classification Search .......... 257/666–777, 257/E23.031–E23.059, E25.031–E25.032, 257/E23.042; 438/6, 28, 66, 67, 107, 109, 438/406, 455–459
See application file for complete search history.

(56) References Cited

U.S. PATENT DOCUMENTS

| | | | |
|---|---|---|---|
| 6,020,629 A * | 2/2000 | Farnworth et al. | 257/686 |
| 7,061,085 B2 * | 6/2006 | Moxham | 257/684 |
| 7,368,809 B2 * | 5/2008 | Huang et al. | 257/678 |
| 7,453,141 B2 * | 11/2008 | Miyagawa et al. | 257/678 |
| 7,642,643 B2 * | 1/2010 | Hall et al. | 257/712 |
| 8,018,076 B2 * | 9/2011 | Sasaki | 257/784 |
| 2003/0194830 A1 * | 10/2003 | Chung | 438/106 |
| 2004/0207066 A1 * | 10/2004 | Hsiao et al. | 257/690 |
| 2005/0012195 A1 * | 1/2005 | Go et al. | 257/686 |
| 2005/0098870 A1 * | 5/2005 | Thomas et al. | 257/690 |
| 2006/0202316 A1 * | 9/2006 | Moxham | 257/684 |
| 2007/0029660 A1 * | 2/2007 | Baek | 257/686 |
| 2007/0040261 A1 * | 2/2007 | Hetzel et al. | 257/686 |
| 2007/0063332 A1 * | 3/2007 | Go et al. | 257/686 |
| 2007/0176279 A1 * | 8/2007 | Kim | 257/690 |
| 2008/0093725 A1 * | 4/2008 | Jung et al. | 257/686 |
| 2008/0203584 A1 | 8/2008 | Katagiri et al. | |

FOREIGN PATENT DOCUMENTS

| | | |
|---|---|---|
| JP | 11-017048 A | 1/1999 |
| KR | 1020060133794 A | 12/2006 |
| KR | 1020090045107 A | 5/2009 |

* cited by examiner

*Primary Examiner* — Dao H Nguyen
*Assistant Examiner* — Tram H Nguyen
(74) *Attorney, Agent, or Firm* — Ladas & Parry LLP

(57) ABSTRACT

A semiconductor package includes a semiconductor chip having a first region defined at a center portion of a first surface of the semiconductor chip, and having second and third regions defined on both sides of the first region, respectively. Bonding pads are disposed in the first region and a substrate having a substrate body is disposed in the second region of the semiconductor chip. The substrate includes an extension portion projecting away from the semiconductor chip. The substrate also includes circuit patterns disposed on the substrate body having a first ends placed adjacent to the bonding pads and second ends placed on the extension portion. Connection members electrically connect the first ends of the circuit patterns and the bonding pads.

20 Claims, 4 Drawing Sheets

SEMICONDUCTOR PACKAGE AND STACK SEMICONDUCTOR PACKAGE HAVING THE SAME

CROSS-REFERENCE TO RELATED APPLICATIONS

The present application claims priority to Korean patent application number 10-2009-0135202 filed on Dec. 31, 2009, which is incorporated herein by reference in its entirety.

BACKGROUND OF THE INVENTION

The present invention relates generally to a semiconductor package, and more particularly, to a semiconductor package suitable for stacking a plurality of semiconductor packages and a stack semiconductor package having the same.

Stack semiconductor packages have been developed, in which at least two memory semiconductor chips are stacked so as to increase a data storage capacity.

Also, a semiconductor chip capable of storing and processing a huge amount of data within a short time and a semiconductor package including the semiconductor chip have been developed. Further, the development of a stack semiconductor package, in which at least two memory semiconductor chips and a system semiconductor chip are stacked so as to improve not only a data storage capacity but also a data processing speed, has been an area of recent interest.

In general, a semiconductor chip has center bonding pads disposed in one line or two lines on the center portion of the semiconductor chip or edge bonding pads disposed adjacent to the edges of the semiconductor chip.

In the case of a semiconductor chip having edge bonding pads, at least two semiconductor chips can be easily stacked and can be easily connected electrically with each other using bonding wires. However, it is difficult to stack multiple semiconductor chips when the semiconductor chips have center bonding pads, and such a configuration can lead to various problems.

In detail, when semiconductor chips having center bonding pads are stacked and electrically connected using bonding wires, the lengths of the bonding wires for connecting the connection pads of a substrate, on which the semiconductor chips are mounted, with the center bonding pads of the semiconductor chips are increased, and therefore the likelihood of short-circuits of bonding wires is increased, and the operating speeds of the semiconductor chips are likely to decrease.

In order to solve these problems, technologies have been developed in which redistribution lines or through-electrodes are formed on or through the semiconductor chips having the center bonding pads. Nevertheless, in these technologies, because a number of subsequent processes must be conducted to form the redistribution lines and the through-electrodes, the number of processes for manufacturing a semiconductor package increases, and the manufacturing cost of the semiconductor package rises.

BRIEF SUMMARY OF THE INVENTION

An embodiment of the present invention includes a semiconductor package which is suitable for stacking a plurality of semiconductor chips having center bonding pads without using long bonding wires, redistribution lines or through-electrodes.

Also, an embodiment of the present invention includes a stack semiconductor package which has at least two above-described packages.

According to an embodiment of the present invention, a semiconductor package includes a semiconductor chip having a first region which is defined on a center portion of a first surface of the semiconductor chip, second and third regions which are defined on both sides of the first region, and bonding pads which are disposed in the first region; a substrate having a substrate body which is disposed in the second region of the semiconductor chip and has an extension portion projecting out of the semiconductor chip, and circuit patterns which are disposed on the substrate body and have first ends placed adjacent to the bonding pads and second ends placed on the extension portion; and connection members electrically connecting the first ends of the circuit patterns and the bonding pads.

The circuit patterns may be disposed in the substrate body, and the substrate body may have openings which expose the first ends and the second ends of the circuit patterns.

The circuit patterns may be disposed on a lower surface of the substrate body which faces the semiconductor chip, and the substrate body may have an opening which exposes the first ends of the circuit patterns.

The connection members may include bonding wires which electrically connect the first ends of the circuit patterns and the bonding pads of the semiconductor chip.

The semiconductor package may further include an insulation member for insulating the bonding wires, and a surface of the insulation member may be flush with a surface of the substrate body.

The semiconductor package may further include an adhesive member covering the bonding wires and the third region, a surface of the adhesive member may be flush with a surface of the substrate body.

The substrate body may have conductive vias which pass through the substrate body, and the conductive vias may be electrically connected with the second ends of the circuit patterns.

The semiconductor package may further include an adhesive disposed on a second surface of the semiconductor chip which faces away from the first surface.

According to an embodiment of the present invention, a stack semiconductor package includes a main substrate having connection pads; a first semiconductor chip disposed on the main substrate, and having a first region which is defined on a center portion of a first surface of the first semiconductor chip, second and third regions which are defined on both sides of the first region, and first bonding pads which are disposed in the first region; a second semiconductor chip disposed over the first semiconductor chip, and having a fourth region, fifth and sixth regions which are respectively defined on both sides of the fourth region and respectively face the second region and the third region, and second bonding pads which are disposed in the fourth region; a first substrate disposed in the second region between the first semiconductor chip and the second semiconductor chip, and having a first substrate body which has a first extension portion projecting out of the first semiconductor chip and first circuit patterns which are disposed on the first substrate body and have first ends placed adjacent to the first bonding pads and second ends placed on the first extension portion; a second substrate disposed in the sixth region between the first semiconductor chip and the second semiconductor chip, and having a second substrate body which has a second extension portion projecting out of the second semiconductor chip and second circuit patterns which are disposed on the second substrate body and have third ends placed adjacent to the second bonding pads and fourth ends placed on the second extension portion; first connection members including first sub connection members which connect the first bonding pads and the first ends and second sub connection members which connect the second bonding pads and third ends; and second connection members including first main connection members which connect the second ends and the connection pads and second main connection members which connect the fourth ends and the connection pads.

The first and second sub connection members and the first and second main connection members may include bonding wires.

The first and second sub connection members may be insulated by insulation members, and surfaces of the insulation members may be flush with surfaces of the first and second substrate bodies.

The first and second substrate bodies may have first and second conductive vias which pass through the first and second substrate bodies, and the first and second conductive vias may be electrically connected with the second ends and the fourth ends, respectively.

The stack semiconductor package may further include first and second solder balls respectively connected to the first and second conductive vias.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
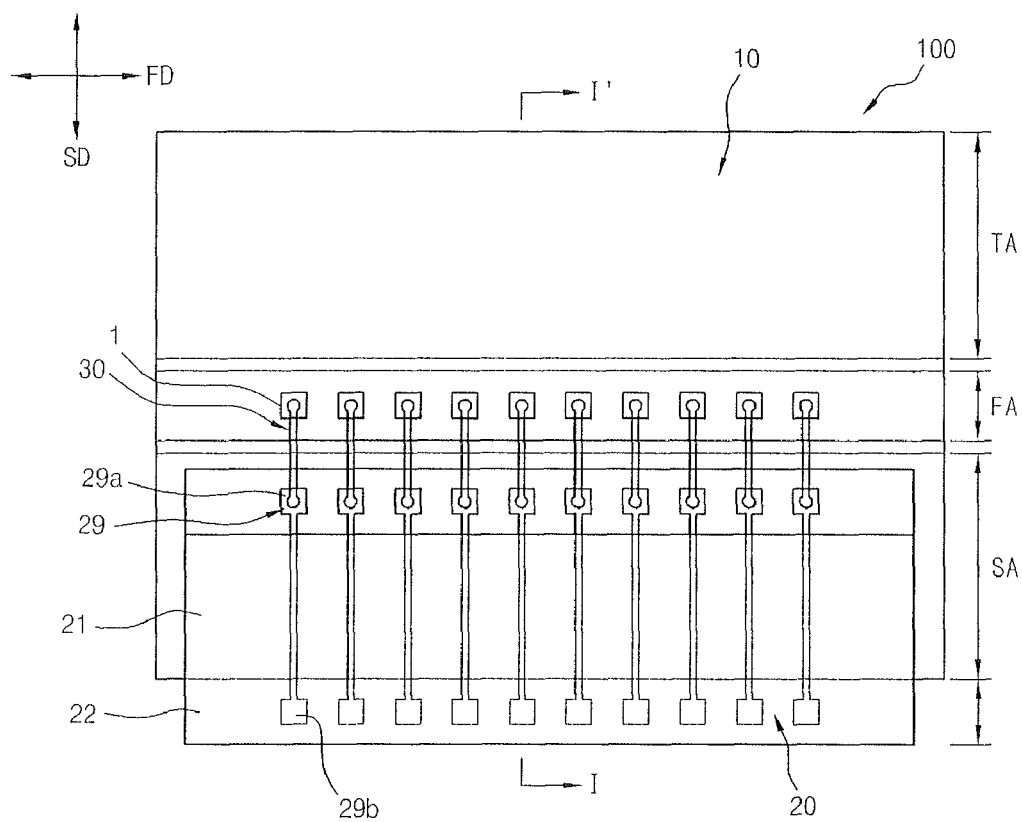
FIG. 1 is a bottom view showing a semiconductor package in accordance with an embodiment of the present invention.
Figure 2:
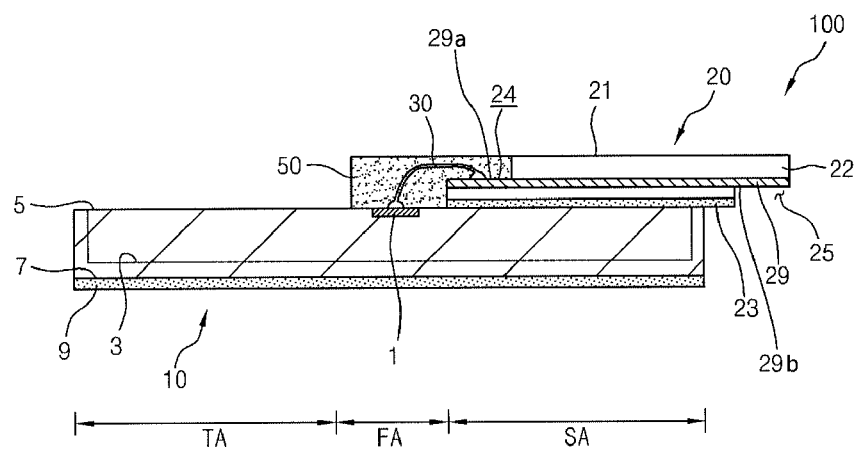
FIG. 2 is a cross-sectional view taken along the line I-I' of FIG. 1.

FIG. 1 is a bottom view showing a semiconductor package in accordance with an embodiment of the present invention, and FIG. 2 is a cross-sectional view taken along the line I-I' of FIG. 1.

Referring to FIGS. 1 and 2, a semiconductor package 100 includes a semiconductor chip 10, a substrate 20, and connection members 30.

The semiconductor chip 10 may have a plate-like shape, although the semiconductor chip 10 is not limited in this regard. As shown in FIG. 2, the semiconductor chip 10 possessing the plate-like shape has a first or upper surface 5 and a second or lower to surface 7 facing away from the first surface 5. The first surface 5 of the semiconductor chip 10 is divided into a first region FA, a second region SA and a third region TA.

As shown in FIG. 1, according to an embodiment the first region FA is defined in the shape of a band on the center portion of is the semiconductor chip 10 along a first direction FD, and the second region SA and the third region TA are respectively defined on both sides of the first region FA. A plurality of bonding pads 1 are arranged in one line or two lines along the first direction in the first region FA of the semiconductor chip 10. FIG. 1 shows an embodiment where the plurality of bonding pads 1 are arranged in one line along the first direction in the first region FA.

A circuit unit 3, which includes a data storage section (not shown) for storing data and/or a data processing section (not shown) for processing data, is formed in the semiconductor chip 10. The circuit unit 3 is electrically connected with the respective bonding pads 1.

An adhesive 9 is disposed on the second surface 7 of the semiconductor chip 10.

The substrate 20 includes a substrate body 21 and circuit patterns 29.

The substrate body 21 has an area that is, for example, slightly greater than the area of the second region SA. For example, the area of the substrate body 21 is greater than the area of the second region SA and less than the area of the first surface 5. The substrate body 21 is disposed in any one of the second region SA and the third region TA. In the exemplary embodiment shown in FIGS. 1 and 2, the substrate body 21 is disposed, for example, in the second region SA, such that the bonding pads 1 disposed in the first region FA are not covered by the substrate body 21. The substrate body 21 disposed in the second region SA has an extension portion 22. According to an embodiment as shown in FIG. 2, the extension portion 22 is defined as a part of the substrate body 21 which projects from the semiconductor chip 10 past a lateral surface thereof. The substrate body 21 is attached to the second region SA of the semiconductor chip 10 by means of an adhesive 23.

The circuit patterns 29 are disposed, for example, in the substrate body 21. The circuit patterns 29 possess a line-like shape when viewed from the top. The circuit patterns 29 are disposed at positions corresponding to the respective bonding pads 1 of the semiconductor chip 10. The circuit patterns 29 have first ends 29a and second ends 29b. The first ends 29a are disposed at positions adjacent to corresponding bonding pads 1 of the semiconductor chip 10, and the second ends 29b are disposed on the extension portion 22. Therefore, the first ends 29a of the respective circuit patterns 29 are disposed at positions corresponding to the respective bonding pads 1 of the semiconductor chip 10.

The substrate body 21 has openings 24 and 25 which expose the first ends 29a and the second ends 29b of the circuit patterns 29.

The connection members 30 electrically connect the first ends 29a of the circuit patterns 29 to the bonding pads 1 corresponding to the first ends 29a of the circuit patterns 29. In an embodiment, the connection members 30 may include bonding wires, although one having skill in the art will understand that the connection members 30 are not limited hereto.

The semiconductor package 100 in accordance with an embodiment of the present invention can further include an insulation member 50. The insulation member 50 insulates the connection members 30 which electrically connect the first ends 29a of the circuit patterns 29 and the bonding pads 1. According to an embodiment, the insulation member 50 may include, for example, epoxy resin. For example, as shown in FIG. 2, the surface of the insulation member 50 can be substantially flush with the surface of the substrate 20.

Figure 3:
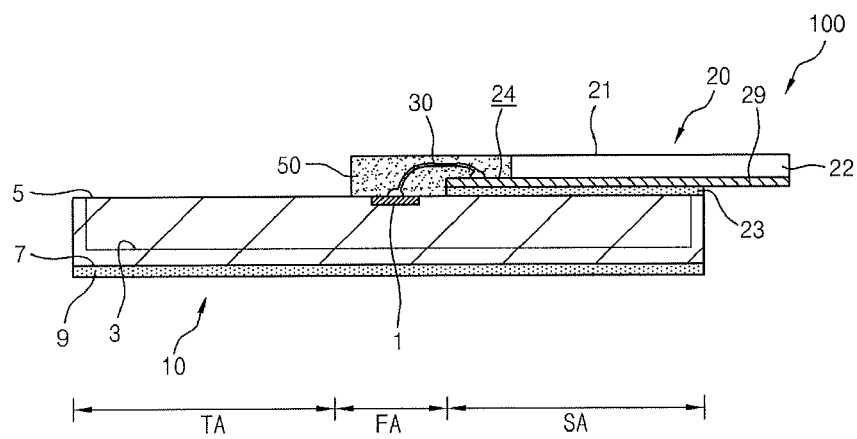
FIG. 3 is a cross-sectional view showing a semiconductor package in accordance with an embodiment of the present invention.

FIG. 3 is a cross-sectional view showing a semiconductor package in accordance with an embodiment of the present invention. The semiconductor package shown in FIG. 3 has substantially the same construction as the semiconductor package described above with reference to FIGS. 1 and 2, except for the substrate 20 and the circuit patterns 29. Therefore, repeated description for the same component parts will be omitted herein, and the same technical terms and the same reference numerals will be used to refer to the same component parts.

Referring to FIG. 3, a semiconductor package 100 includes a semiconductor chip 10, a substrate 20, and connection members 30. Circuit patterns 29 of the substrate 20 are disposed on the lower surface of the substrate 20 which faces a first surface 5 of the semiconductor chip 10. A substrate body 21 has an opening which exposes the first ends of the circuit patterns 29. As shown in FIG. 3, the circuit patterns 29 are disposed on the lower surface of the substrate 20, and therefore it is possible to prevent the thickness of the substrate body 21 from increasing due to the loop height of the connection members 30.

Figure 4:
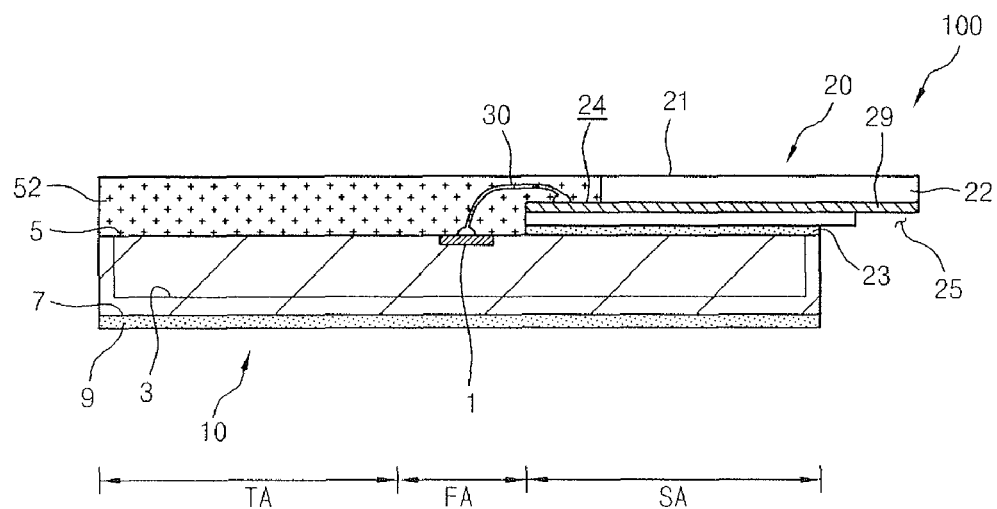
FIG. 4 is a cross-sectional view showing a semiconductor package in accordance with an embodiment of the present invention.

FIG. 4 is a cross-sectional view showing a semiconductor package in accordance with an embodiment of the present invention. The semiconductor package shown in FIG. 4 has substantially the same construction as the semiconductor package described above with reference to FIGS. 1 and 2, except for an adhesive member formed over the third region TA and the connection members 30. Therefore, repeated description for the same component parts will be omitted herein, and the same technical terms and the same reference numerals will be used to refer to the same component parts.

Referring to FIG. 4, a semiconductor package 100 includes a semiconductor chip 10, a substrate 20, connection members 30, and a second adhesive member 52. The second adhesive member covers the third region TA of a first surface 5 of the semiconductor chip 10 and the connection members 30, which connect the bonding pads 1 and the first ends of the circuit patterns 29. In the embodiment, the adhesive member 52 includes a soft adhesive member, and the surface of the adhesive member 52 can be substantially flush with the surface of the substrate 20.

Figure 5:
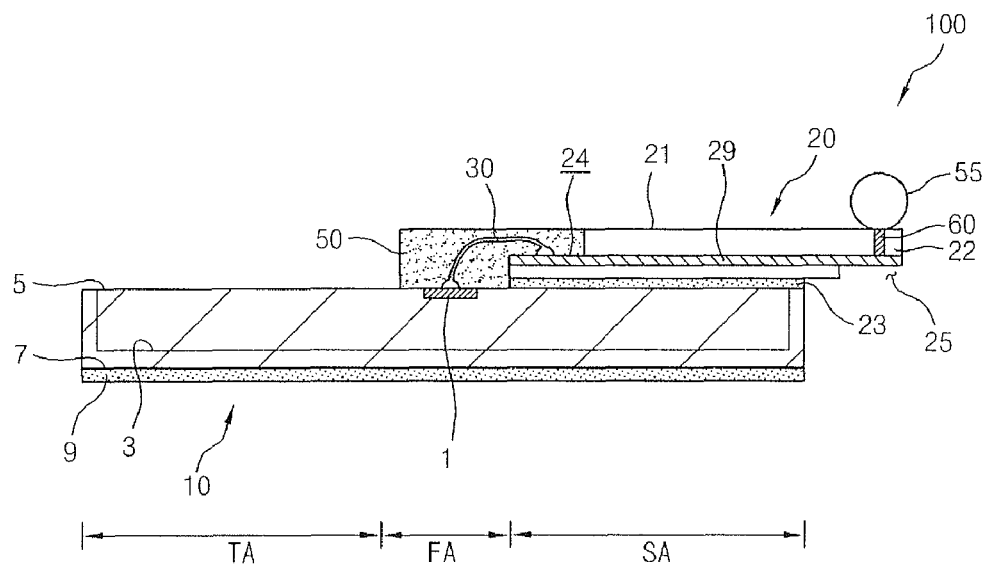
FIG. 5 is a cross-sectional view showing a semiconductor package in accordance with an embodiment of the present invention.

FIG. 5 is a cross-sectional view showing a semiconductor package in accordance with an embodiment of the present invention. The semiconductor package shown in FIG. 5 has substantially the same construction as the semiconductor package described above with reference to FIGS. 1 and 2, except for the addition of conductive vias and connection members. Therefore, repeated description for the same component parts will be omitted herein, and the same technical terms and the same reference numerals will be used to refer to the same component parts.

Referring to FIG. 5, a semiconductor package 100 includes a semiconductor chip 10, a substrate 20, connection members 30, conductive vias 60, and coupling members 55. The conductive vias 60 pass through a substrate body 21 and include a conductive material. The conductive vias 60 may be formed in a pin-like shape, or in any other shape as known in the art. The conductive vias 60 passing through the substrate body 21 are electrically connected with circuit patterns 29. The coupling members 55 are disposed to be connected with portions of the conductive vias 60 which are not connected with the circuit patterns 29. In the embodiment, the coupling members 55 may include solder balls or the like.

Figure 6:
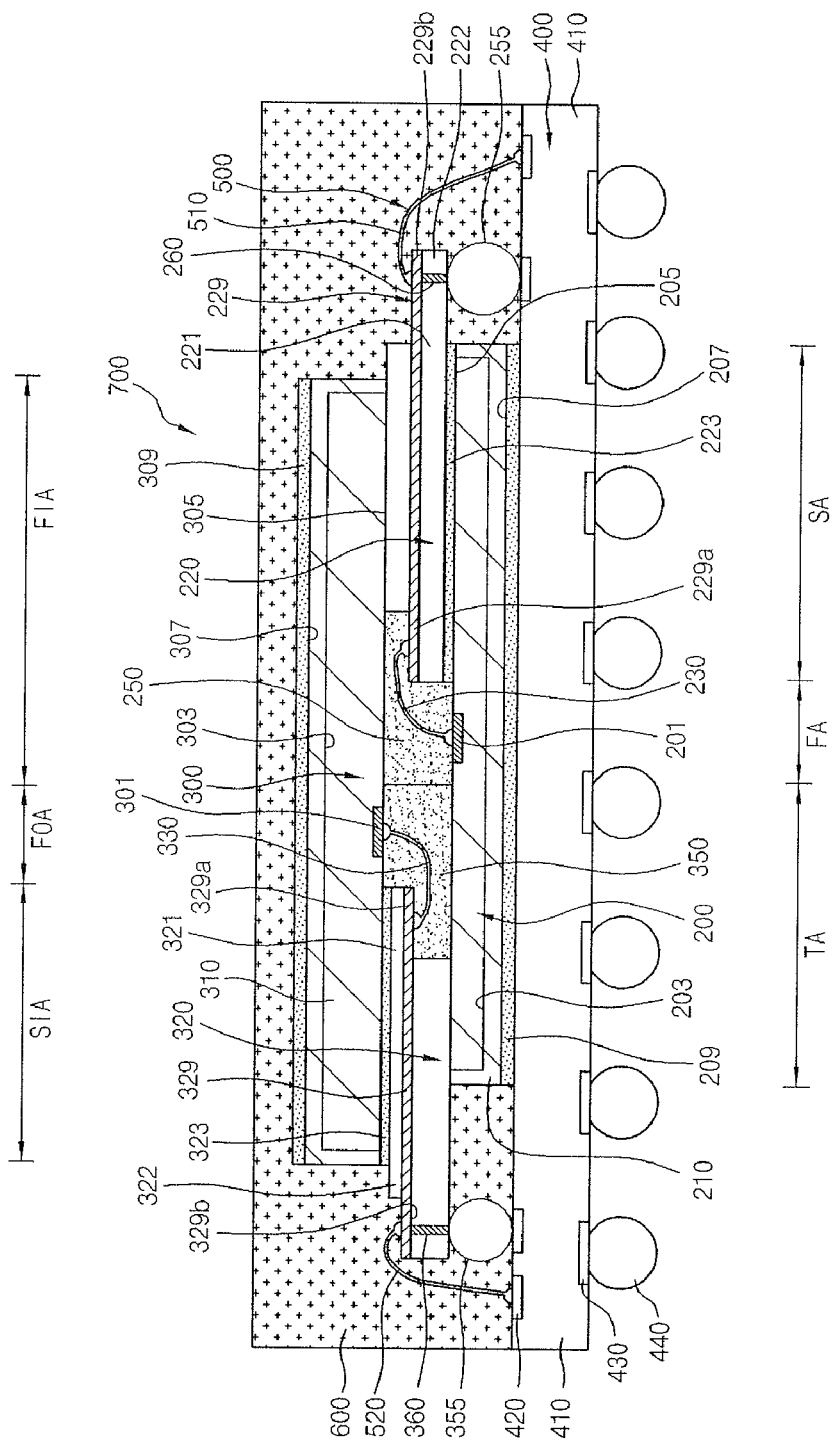
FIG. 6 is a cross-sectional view showing a stack semiconductor package in accordance with an embodiment of the present invention.

FIG. 6 is a cross-sectional view showing a stack semiconductor package in accordance with an embodiment of the present invention.

Referring to FIG. 6, a stack semiconductor package 700 includes a main substrate 400, a first semiconductor chip 200, a second semiconductor chip 300, a first sub substrate 220, a second sub substrate 320, sub connection members 230 and 330, main connection members 510 and 520, and a molding member 600.

The main substrate 400 includes a main substrate body 410, connection pads 420, ball lands 430, and solder balls 440. The main substrate body 410 is shown to have a plate-like shape, although the present invention is not limited in this regard. The connection pads 420 are disposed adjacent to the edges of the upper surface of the main substrate body 410, and the ball lands 430 are disposed on the lower surface of the main substrate body 410 which faces away from the upper surface. The ball lands 430 are electrically connected with the connection pads 420, and the solder balls 440 are attached to the ball lands 430.

The first semiconductor chip 200 is disposed on a center portion of the upper surface of the main substrate 400. The first to semiconductor chip 200 may have, for example, a plate-like shape. The first semiconductor chip 200 possessing the plate-like shape has a first surface 205 and a second surface 207 facing away from the first surface 205. The first surface 205 of the first semiconductor chip 200 is divided into a first region FA, a second region SA, and a third region TA. The first region FA is defined in the shape of a band on the center portion of the first semiconductor chip 200, and the second region SA and the third region TA are respectively defined on both sides of the first region FA.

A plurality of first bonding pads 201 are arranged in one line or two lines in the first region FA of the first semiconductor chip 200. In the embodiment as shown in FIG. 6, the plurality of first bonding pads 201 are arranged in one line in the first region FA. In the embodiment as shown in FIG. 6, the first semiconductor chip 200 is disposed in a face-up configuration on the main substrate 400.

A first circuit unit 203, which includes a data storage section (not shown) for storing data and/or a data processing section (not shown) for processing data, is formed in the first semiconductor chip 200. The first circuit unit 203 is electrically connected to the respective first bonding pads 201. An adhesive 209 is attached to the second surface 207 of the first semiconductor chip 200 for attaching the first semiconductor chip 200 to the main substrate 400.

The second semiconductor chip 300 is disposed over the upper surface of the first semiconductor chip 200. The second semiconductor chip 300 possesses, for example, a plate-like shape. The second semiconductor chip 300 possessing the plate-like shape has a third surface 305 and a fourth surface 307 which faces away from the third surface 305. The third surface 305 of the second semiconductor chip 300 is disposed to face the first surface 205 of the first semiconductor chip 200.

The third surface 305 of the second semiconductor chip 300 is divided into a fourth region FOA, a fifth region FIA, and a sixth region SIA. The fourth region FOA is defined in the shape of a band on the center portion of the second semiconductor chip 300, and the fifth region FIA and the sixth region SIA are respectively defined on both sides of the fourth region FOA. The fourth region FOA is defined not to overlap with the first region FA of the first semiconductor chip 200. The second region SA of the first semiconductor chip 200 faces the fifth region FIA of the second semiconductor chip 300, and the third region TA of the first semiconductor chip 200 faces the sixth region SIA of the second semiconductor chip 300.

A plurality of second bonding pads 301 are arranged in one line or two lines in the fourth region FOA of the second semiconductor chip 300. In the embodiment, the plurality of second bonding pads 301 are arranged in one line in the fourth region FOA. According to the embodiment shown in FIG. 6, the second semiconductor chip 300 is disposed in a face-down configuration over the first semiconductor chip 200.

A second circuit unit 303, which includes a data storage section (not shown) for storing data and/or a data processing section (not shown) for processing data, is formed in the second semiconductor chip 300. The second circuit unit 303 is electrically connected with the respective second bonding pads 301. An adhesive 309 is attached to the fourth surface 307 of the second semiconductor chip 300.

The first sub substrate 220 includes a first sub substrate body 221 and first circuit patterns 229. The first sub substrate 220 is interposed between the first semiconductor chip 200 and the second semiconductor chip 300. For example, the first sub substrate 220 is interposed between the second region SA of the first semiconductor chip 200 and the fifth region FIA of the second semiconductor chip 300.

The first sub substrate body 221 has an area that is, for example, slightly greater than the area of the second region SA. For example, the area of the first sub substrate body 221 is greater than the area of the second region SA and less than the area of the first surface 205. The first sub substrate body 221 disposed in the second region SA has a first extension portion 222. The first extension portion 222 is a portion of the first sub substrate body 221 which projects away from the first semiconductor chip 200. The first sub substrate body 221 is attached to the second region SA of the first semiconductor chip 200 by means of a first adhesive 223.

The first circuit patterns 229 are disposed in or on the surface of the first sub substrate body 221. In the embodiment shown in FIG. 6, the first circuit patterns 229 are disposed in the first sub substrate body 221. The first circuit patterns 229 possess a line-like shape when viewed from the top. The first circuit patterns 229 are disposed at positions corresponding to the respective first bonding pads 201 of the first semiconductor chip 200. The first circuit patterns 229 have first ends 229a and second ends 229b opposite the first ends 229a. The first ends 229a are disposed adjacent to corresponding first bonding pads 201, and the second ends 229b are disposed on the first extension portion 222.

The first sub substrate 220 includes first conductive vias 260 which pass through the first sub substrate body 221. The first conductive vias 260 are electrically connected with the first circuit patterns 229 at second ends 229b thereof. First solder balls 255 can be connected to the first conductive vias 260. The first solder balls 255 can be connected with the connection pads 420 of the main substrate 400.

The second sub substrate 320 includes a second sub substrate body 321 and second circuit patterns 329. The second sub substrate 320 is interposed between the first semiconductor chip 200 and the second semiconductor chip 300. For example, the second sub substrate 320 is interposed between the third region TA of the first semiconductor chip 200 and the sixth region SIA of the second semiconductor chip 300.

The second sub substrate body 321 has an area that is, for example, slightly greater than the area of the sixth region SIA. For example, the area of the second sub substrate body 321 is greater than the area of the sixth region SIA and less than the area of the third surface 305. The second sub substrate body 321 disposed in the sixth region SIA has a second extension portion 322. As shown in FIG. 6, the second extension portion 322 is a portion of the second sub substrate body 321 which projects away from the second semiconductor chip 300. The second sub substrate body 321 is attached to the sixth region SIA of the second semiconductor chip 300 by a second adhesive 323.

The second circuit patterns 329 are disposed in or on the surface of the second sub substrate body 321. In the embodiment shown in FIG. 6, the second circuit patterns 329 are disposed in the second sub substrate body 321. The second circuit patterns 329 possess a line-like shape when viewed from the top. The second circuit patterns 329 are disposed at positions corresponding to the respective second bonding pads 301 of the second semiconductor chip 300. The second circuit patterns 329 have third ends 329a and fourth ends 329b opposite the third ends 329a. The third ends 329a are disposed adjacent to corresponding second bonding pads 301, and the fourth ends 329b are disposed on the second extension portion 322.

The second sub substrate 320 includes second conductive vias 360 which pass through the second sub substrate body 321. The second conductive vias 360 are electrically connected to the second circuit patterns 329. Second solder balls 355 can be connected to the second conductive vias 360. The second solder balls 355 can be connected with the connection pads 420 of the main substrate 400.

The sub connection members 230 and 330 include first sub connection members 230 and second sub connection members 330. The first sub connection members 230 include, for example, bonding wires, and electrically connect the first bonding pads 201 of the first semiconductor chip 200 and the first ends 229a of the first circuit patterns 229 of the first sub substrate 220. The second sub connection members 330 include, for example, bonding wires, and electrically connect the second bonding pads 301 of the second semiconductor chip 300 and the third ends 329a of the second circuit patterns 329 of the second sub substrate 320.

In the embodiment shown in FIG. 6, the first sub connection members 230 and the second sub connection members 330 can be covered by insulation members 250 and 350 respectively, the insulation members are formed of a insulative material such as epoxy resin. Alternatively, the first sub connection members 230 and second sub connection members 330 can be surrounded by insulation tapes, etc. In the embodiment shown in FIG. 6, the surfaces of the insulation members are placed on the same plane as the first and second sub substrate bodies 221 and 231.

Main connection members 500 include the first main connection members 510 and the second main connection members 520. The first main connection members 510 electrically connect the second ends 229b of the first circuit patterns 229 and the connection pads 420 of the main substrate 400. According to an embodiment, the first main connection members 510 can include, for example, bonding wires, although it should be understood that the connection members 510 are not limited in this regard. The second main connection members 520 electrically connect the fourth ends 329b of the second circuit patterns 329 and the connection pads 420 of the main substrate 400. In the embodiment, the second main connection members 520 can include, for example, bonding wires, although it should be understood that the connection members 520 are not limited in this regard.

The molding member 600 encapsulates the main substrate 400 and the first and second semiconductor chips 200 and 300. The molding member 600 can include epoxy resin or another encapsulant.

As is apparent from the above description, in the present invention, a plurality of semiconductor chips can be stacked without using long bonding wires, redistribution lines or through-electrodes.

Accordingly, in the present invention, the plurality of semiconductor chips can be easily stacked, and a stack semiconductor package can be realized without markedly increasing the number of semiconductor package manufacturing processes and the manufacturing cost.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
    a semiconductor chip having a first region defined at a center portion of a first surface of the semiconductor chip, and having a second region and a third region defined at both sides of the first region, respectively, wherein bonding pads are disposed in the first region;
    a substrate comprising:
        a substrate body disposed on the second region excluding the third region, the substrate body including an extension portion that projects away from the semiconductor chip; and
        circuit patterns having first ends placed adjacent to the bonding pads and second ends placed on the extension portion, wherein an upper surface of the circuit patterns is exposed from the substrate body at the first ends of the circuit patterns and a lower surface of the circuit patterns opposite the upper surface is exposed from the substrate body at the second ends of the circuit patterns; and
    connection members electrically connecting the first ends of the circuit patterns and the bonding pads.

2. The semiconductor package according to claim 1, wherein the circuit patterns are disposed within the substrate body.

3. The semiconductor package according to claim 2, wherein openings are defined in the substrate body to expose the first ends and the second ends of the circuit patterns.

4. The semiconductor package according to claim 1, wherein the circuit patterns are disposed on a lower surface of the substrate body which faces the semiconductor chip.

5. The semiconductor package according to claim 4, wherein an opening is defined in the substrate body to expose the first ends of the circuit patterns.

6. The semiconductor package according to claim 1, wherein the connection members comprise bonding wires which electrically connect the first ends of the circuit patterns to the bonding pads of the semiconductor chip.

7. The semiconductor package according to claim 6, further comprising:
    an insulation member for insulating the bonding wires.

8. The semiconductor package according to claim 7, wherein a surface of the insulation member is flush with a surface of the substrate body.

9. The semiconductor package according to claim 4, further comprising:
    an adhesive member covering the bonding wires and the third region.

10. The semiconductor package according to claim 9, wherein a surface of the adhesive member is flush with a surface of the substrate body.

11. The semiconductor package according to claim 1, wherein the substrate body further comprises conductive vias passing therethrough.

12. The semiconductor package according to claim 11, wherein the conductive vias are electrically connected to the second ends of the circuit patterns.

13. The semiconductor package according to claim 1, further comprising:
    an adhesive disposed on a second surface of the semiconductor chip which faces away from the first surface.

14. A stack semiconductor package comprising:
    a main substrate having connection pads disposed thereon;
    a first semiconductor chip disposed on the main substrate, and having a first region defined at a center portion of a first surface of the first semiconductor chip, and having a second region and a third region defined at both sides of the first region, respectively, wherein first bonding pads are disposed in the first region;
    a second semiconductor chip disposed over the first semiconductor chip, and having a fourth region defined at a center portion thereof, and having a fifth region and a sixth region defined at both sides of the fourth region, respectively,
        wherein the fourth region is defined not to overlap with the first region, the fifth region and the sixth region face the second region and the third region respectively, and second bonding pads are disposed in the fourth region;
    a first substrate disposed in the second region between the first semiconductor chip and the second semiconductor chip, the first substrate comprising:
        a first substrate body having a first extension portion that projects away from the first semiconductor chip; and
        first circuit patterns having first ends placed adjacent to the first bonding pads and second ends placed on the first extension portion;
    a second substrate disposed in the sixth region between the first semiconductor chip and the second semiconductor chip, the second substrate comprising:
        a second substrate body having a second extension portion that projects away from the second semiconductor chip; and
        second circuit patterns having third ends placed adjacent to the second bonding pads and fourth ends placed on the second extension portion;
    first sub connection members electrically connecting the first bonding pads and the first ends;
    second sub connection members electrically connecting the second bonding pads and third ends;
    first main connection members electrically connecting the second ends and the connection pads; and
    second main connection members electrically connecting the fourth ends and the connection pads.

15. The stack semiconductor package according to claim 14, wherein each of the first sub connection members, the second sub connection members, the first main connection members, and second main connection members comprise bonding wires.

16. The stack semiconductor package according to claim 14, wherein the first sub connection members and second sub connection members are insulated by insulation members.

17. The stack semiconductor package according to claim 16, wherein surfaces of the insulation members are flush with surfaces of the first and second substrate bodies.

18. The stack semiconductor package according to claim 14, wherein the first substrate body comprises a first conductive via passing therethrough, and the second substrate body comprises a second conductive via passing therethrough.

19. The stack semiconductor package according to claim 14, wherein the first and second conductive vias are electrically connected with the second ends and the fourth ends, respectively.

20. The stack semiconductor package according to claim 18, further comprising:
    first and second solder balls respectively connected to the first and second conductive vias.

* * * * *